United States Patent [19]
Hashimoto

[11] Patent Number: 5,270,600
[45] Date of Patent: Dec. 14, 1993

[54] MAGNETIC DRIVE DEVICE

[75] Inventor: Taisaku Hashimoto, Kashiwara, Japan

[73] Assignee: Koyo Seiko Co. Ltd., Osaka, Japan

[21] Appl. No.: 879,428

[22] Filed: May 7, 1992

[30] Foreign Application Priority Data

May 8, 1991 [JP] Japan ................................. 3-102815

[51] Int. Cl.[5] ........................................... H02K 7/10
[52] U.S. Cl. .................................. 310/75 D; 464/29
[58] Field of Search ...................... 310/75 D, 90.5, 15, 310/20, 12; 464/29

[56] References Cited

U.S. PATENT DOCUMENTS

| 4,381,466 | 4/1983 | Laenens . |
| 4,732,225 | 3/1988 | Jurgens et al. ................. 464/29 X |
| 4,998,859 | 3/1991 | Oshima et al. . |
| 5,046,992 | 9/1991 | Tamai et al. . |

FOREIGN PATENT DOCUMENTS

| 0034992 | 9/1981 | European Pat. Off. . |
| 0037368 | 10/1981 | European Pat. Off. . |
| 469209 | 4/1969 | France . |
| 56-150650 | 11/1981 | Japan . |

OTHER PUBLICATIONS

Hitachi Ltd, Patent Abstract of Japan; "Eading-In Mechanism for Rotational and Linear Motions," vol. II No. 288 (E-542) (2735) Sep. 17, 1987.
Hitachi Ltd, Patent Abstract of Japan; "Rotary Electric Machine Having Magnetic Bearing," vol. II (E-470) (2458) Jan. 13, 1987.

Primary Examiner—Steven L. Stephan
Assistant Examiner—E. To
Attorney, Agent, or Firm—Mason, Fenwick and Lawrence

[57] ABSTRACT

A magnetic drive device comprising a rotor disposed inside a cylindrical wall so as to be rotatable and axially movable, a fixed magnetic bearing fixedly provided on the cylindrical wall for holding the rotor radially thereof, a magnetic coupling having a drive portion disposed around the cylindrical wall so as to be rotatable and axially movable for transmitting a torque and an axial holding force to the rotor, and a movable magnetic bearing disposed around the cylindrical wall so as to be axially movable with the drive portion of the magnetic coupling for holding the rotor radially thereof.

10 Claims, 9 Drawing Sheets

MAGNETIC DRIVE DEVICE

BACKGROUND OF THE INVENTION

The present invention relates to a magnetic drive device for driving a rotor in rotation and also axially while outside a cylindrical wall, such as a vacuum shield, having the rotor disposed therein, so that the drive device is magnetically out of contact with the rotor. The invention also relates, for example, to such a magnetic drive device for use in semiconductor production apparatus for handling wafers in a vacuum.

Magnetic drive devices are known which are adapted to drive a rotor which is held out of contact therewith by a cylindrical wall and which comprise two movable housings provided outside the cylindrical wall axially movably, a magnetic bearing disposed in one of the housings for holding the rotor radially and axially thereof, and a magnetic coupling having a drive portion provided in the other housing for transmitting a torque to the rotor.

With the magnetic drive device, the rotor is rotated by rotating the drive portion of the magnetic coupling and is moved axially by axially moving the housings owing to the axial holding force of the magnetic bearing.

However, the following problem is encountered when the magnetic drive device described is used for driving the rotor disposed inside the cylindrical wall.

The magnetic bearing generally has a small air gap and is made movable along the cylindrical wall. The cylindrical wall must therefore be reduced in thickness and machined with high accuracy. However since the above drive device has two housings which are movable along the cylindrical wall, the wall needs to have an increased length. Accordingly, extreme difficulties are encountered in making such a cylindrical wall with a reduced wall thickness and in achieving, high by machining.

For this reason, the magnetic bearing to be used actually has a large air gap. However this reduces the holding force of the bearing especially in the axial direction, consequently necessitating an increased control current and therefore a magnetic bearing of larger size to obtain a sufficient axial holding force.

We have already proposed a magnetic drive device which comprises a rotor disposed inside a cylindrical wall so as to be rotatable and axially movable, two magnetic bearings fixedly provided on the cylindrical wall toward one end thereof for radially holding the rotor at two portions spaced apart axially thereof, and a magnetic coupling having a drive portion disposed around the cylindrical wall toward the other end thereof so as to be rotatable and axially movable for transmitting a torque and an axial holding force to the rotor (see Japanese Patent Application HEI 3-30913).

With the proposed magnetic drive device, however, the two magnetic bearings for holding the rotor radially thereof are arranged toward one end of the cylindrical wall and axially spaced apart by a small distance. This entails the problem that the rotor is dynamically in poor balance and is liable to incline, thereby adversely affecting the control or the magnetic bearings.

SUMMARY OF THE INVENTION

The main object of the present invention is to provide a magnetic drive device which is small-sized, but nevertheless affords an increased torque and is adapted to hold the rotor in good balance.

The present invention provides a magnetic drive device which comprises a rotor disposed inside a cylindrical wall so as to be rotatable and axially movable, a fixed magnetic bearing fixedly provided on the cylindrical wall for holding the rotor radially thereof, a magnetic coupling having a drive portion disposed around the cylindrical wall so as to be rotatable and axially movable for transmitting a torque and an axial holding force to the rotor, and a movable magnetic bearing disposed around the cylindrical wall so as to be axially movable with the drive portion of the magnetic coupling for holding the rotor radially thereof.

Because the fixed magnetic bearing is fixedly provided on the cylindrical wall, the air gap between the rotor and the fixed magnetic bearing can be reduced. Further because the magnetic coupling drive portion and the movable magnetic bearing only need to be made movable along the cylindrical wall, the portion of the wall along which these components move can be shorter. This makes it relatively easy to prepare the cylindrical wall with a reduced thickness and with high accuracy. Thus, the air gap between the fixed magnetic bearing and the rotor can be reduced, and the portion of the cylindrical wall for the movable magnetic bearing to move along can be made thinner, so that both the fixed magnetic bearing and the movable magnetic bearing can be compacted, and yet a sufficient holding force is available. When the cylindrical wall portion for the movable bearing to move along can be reduced in thickness, the magnetic coupling need not have a large size since the drive portion of the magnetic coupling moves around the thin wall portion. Furthermore, the movable magnetic bearing, which axially moves with the magnetic coupling, can be spaced apart from the fixed magnetic bearing by a larger distance. The bearings therefore hold the rotor dynamically in improved balance and render the rotor less likely to incline to obviate the adverse influence to be otherwise produced on the control of the magnetic bearings. This reduces the burden on these bearings.

According to an aspect of the invention, the drive portion of the magnetic coupling and a peripheral surface of the rotor opposed thereto with the cylindrical wall positioned therebetween are provided with a plurality of permanent magnet devices each comprising opposed permanent magnets, the permanent magnets of each permanent magnet device being so arranged as to form in the permanent magnet device a closed magnetic path spreading out radially and axially of the rotor.

This arrangement makes it possible to transmit to the rotor an axial holding force in addition to the torque.

The permanent magnets of each permanent magnet device may be so arranged as to form in the permanent magnet device a closed magnetic path spreading out radially, axially and circumferentially of the rotor.

The torque and the axial holding force can then be further increased.

According to another aspect of the invention, the rotor is an outer rotor in the form of a cylinder, and the magnetic coupling is a first magnetic coupling, an inner rotor being inserted in the outer rotor so as to project at least at an end portion thereof beyond an end of the outer rotor and supported rotatably relative to the outer rotor, a second magnetic coupling having a drive portion disposed around the cylindrical wall so as to be axially movable with the first magnetic coupling drive portion and the movable magnetic bearing and to be rotatable, the second magnetic coupling drive portion being operable to transmit a torque and an axial holding force to the portion of the inner rotor projecting beyond the end of the outer rotor.

The outer rotor and the inner rotor, which are arranged inside the cylindrical wall, can then be axially moved together and rotated independently of each other by the fixed magnetic bearing, the movable magnetic bearing and the first and second magnetic couplings which are arranged outside the cylindrical wall and held out of contact with the outer and inner rotors.

The invention further provides a magnetic drive device which comprises a rotatable member disposed inside a cylindrical wall so as to be rotatable and axially movable, a fixed magnetic bearing fixedly provided on the cylindrical wall for holding the rotatable member radially thereof, a motor stator disposed around the cylindrical wall so as to be axially movable for directly driving a motor rotor formed on the rotatable member, and a movable magnetic bearing disposed around the cylindrical wall so as to be axially movable with the motor stator for holding the rotatable member radially and axially thereof.

With the fixed magnetic bearing fixedly provided on the cylindrical wall, the motor stator and the movable magnetic bearing only are movable along the cylindrical wall, so that the device has the same advantage as above. Moreover, since the motor rotor formed on the rotatable member is directly driven by the motor stator disposed therearound, the rotatable member can be positioned accurately and held at rest with high accuracy, with vibration inhibited while the rotatable member is at rest. With the motor stator disposed around the rotatable member,, the arrangement including these components can be provided in a reduced size by a decreased number of parts. Use of the decreased number of parts makes it possible to assemble the device with improved efficiency and to give an improved quality to the device.

The movable magnetic bearing and the rotatable member may be toothed at portions thereof opposed to each other for producing an axial holding force.

The device may be provided with a magnetic coupling having a drive portion for transmitting an axial holding force to the rotatable member, the drive portion being disposed around the cylindrical wall so as to be axially movable with the motor stator and the movable magnetic bearing.

According to another aspect of the invention, the rotatable member is an outer rotor in the form of a cylinder, the motor rotor being a first motor rotor, the motor stator being a first motor stator, an inner rotor being inserted in the outer rotor so as to project at least at an end portion thereof beyond an end of the outer rotor and supported rotatably relative to the outer rotor, the portion of the inner rotor projecting beyond the end of the outer rotor being formed with a second motor rotor, a second motor stator being disposed around the cylindrical wall so as to be axially movable with the first motor stator and the movable magnetic bearing for directly driving the second motor rotor.

The movable magnetic bearing and the outer rotor may be toothed at portions thereof opposed to each other for producing an axial holding force.

The device may be provided with a magnetic coupling having a drive portion for transmitting an axial holding force to the outer rotor, the drive portion being disposed around the cylindrical wall so as to be axially movable with the first motor stator, the second motor stator and the movable magnetic bearing.

DESCRIPTION OF THE PREFERRED EMBODIMENTS

Figure 1:
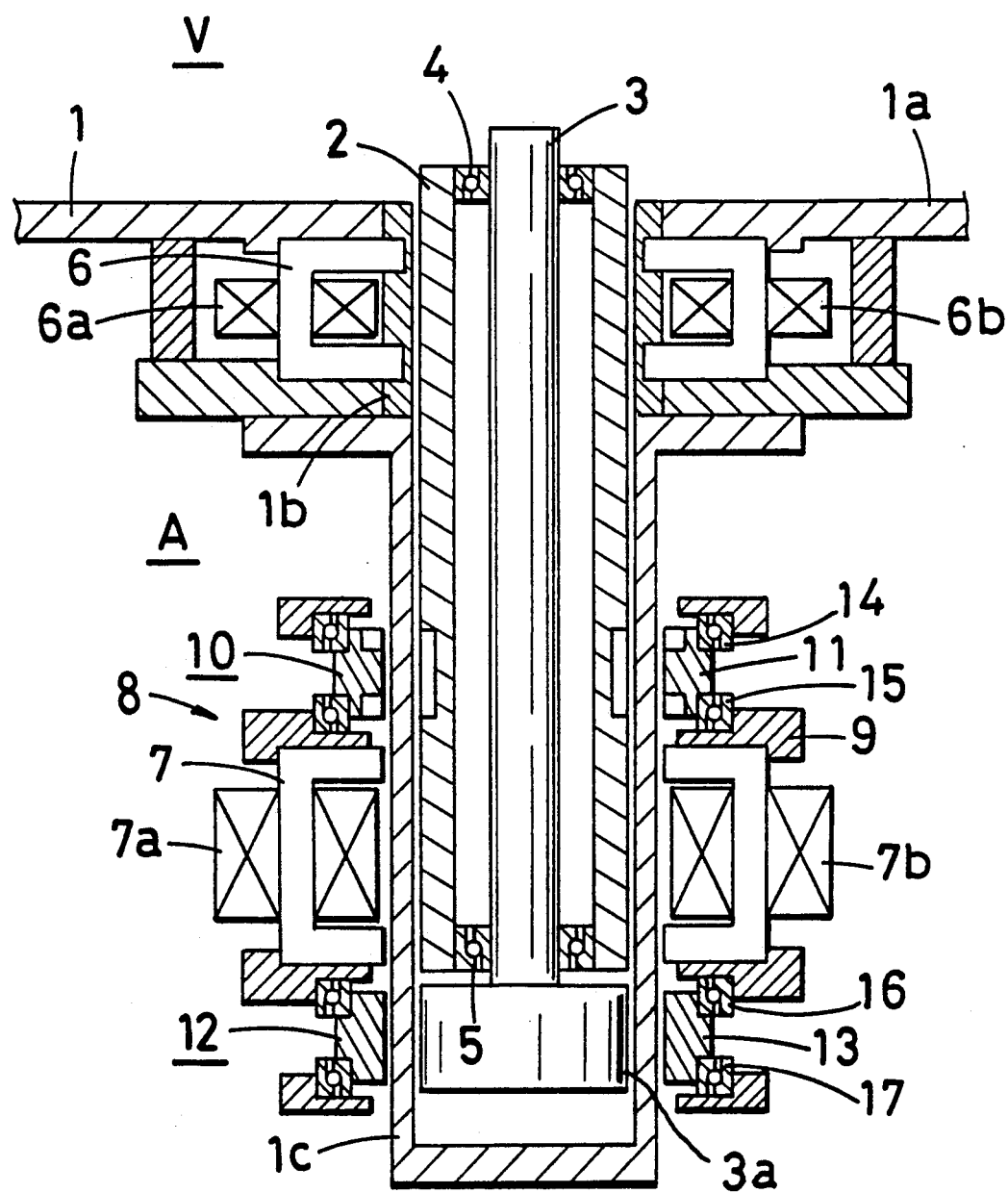
FIG. 1 is a view in vertical section showing a magnetic drive device embodying the invention.

Several embodiments of the present invention will be described below with reference to the accompanying drawings. Throughout the drawings, like parts are designated by like reference numerals. In the following description, the upper and lower sides of FIGS. 1, 5 and 7 to 9 will be referred to as "upper" and "lower," respectively. The direction of rotation will be referred to as the device is seen from above. With respect to the direction of rotation, the clockwise direction will be referred to as "rightward," and the counterclockwise direction as "leftward."

FIG. 1 shows a magnetic drive device disposed in the atmosphere A outside a vacuum shield 1 for driving an outer rotor 2 and an inner rotor 3 which are arranged in a vacuum V inside the shield 1.

The shield 1 comprises an upper cylindrical wall 1b extending vertically downward from an apertured portion of a horizontal wall 1a, and a lower cylindrical wall 1c having a bottom and extending vertically downward from the lower end of the wall 1b. The two rotors 2, 3 are arranged in the vacuum V within the upper and lower cylindrical walls 1b, 1c so as to be rotatable and vertically movable.

The outer rotor 2 is in the form of a vertical hollow cylinder and is fitted in the cylindrical walls 1b, 1c with a small clearance formed around the rotor 2 within the walls.

The inner rotor 3 is in the form of a vertical rod and is inserted in the outer rotor 2 coaxially therewith so as to project at its upper and lower ends beyond the outer rotor 2. The inner rotor 3 is supported by upper and lower two bearings 4, 5 on the outer rotor 2 so as to be rotatable relative to the rotor 2 although vertically immovable relative thereto. The lower end of the inner rotor 3 projecting downward beyond the lower end of the outer rotor 2 has a large-diameter portion 3a in the form of a short column and approximately equal to the outer rotor 2 in outside diameter.

A fixed magnetic bearing 6 is fixed to the upper cylindrical wall 1b around the outer rotor 2.

A movable unit 8 is disposed around the lower cylindrical wall 1c.

The movable unit 8 comprises a movable housing 9, movable magnetic bearing 7 disposed in the middle portion of the housing 9, drive portion (first drive portion) 11 of a first magnetic coupling 10 disposed in the upper portion of the housing 9, and drive portion (second drive portion) 13 of a second magnetic coupling 12 disposed in a lower portion of the housing 9.

The fixed magnetic bearing 6 and the movable magnetic bearing 7 are those already known and comprise, for example, four electromagnets 6a, 6b, 7a, 7b at four locations spaced apart along a circumference for holding the outer rotor 2 chiefly radially thereof. FIG. 1 shows only two electromagnets 6a, 6b (7a, 7b) of the magnetic bearing 6 (7) at the left and right of the drawing, and the remaining two electromagnets on the front side and rear side of the plane of the drawing are not shown.

The housing 9 is moved vertically along the lower cylindrical wall 1c by unillustrated suitable means.

The first and second drive portions 11, 13 are each in the form of a ring coaxial with the cylindrical wall 1c and are respectively supported by bearings 14, 15 and 16, 17 on the housing 9 so as to be rotatable about the axis. Although not shown, the first and second drive portions 11, 13 are rotatable independently of each other by a first motor and a second motor, respectively, which are provided in the housing 9.

The drive portion 11 of the first magnetic coupling 10 is opposed to the outer peripheral surface of a lower portion of the outer rotor 2 with the lower cylindrical wall 1c positioned therebetween. The first magnetic coupling 10 has a driven portion provided in the lower portion peripheral surface of the outer rotor 2.

Figure 2:
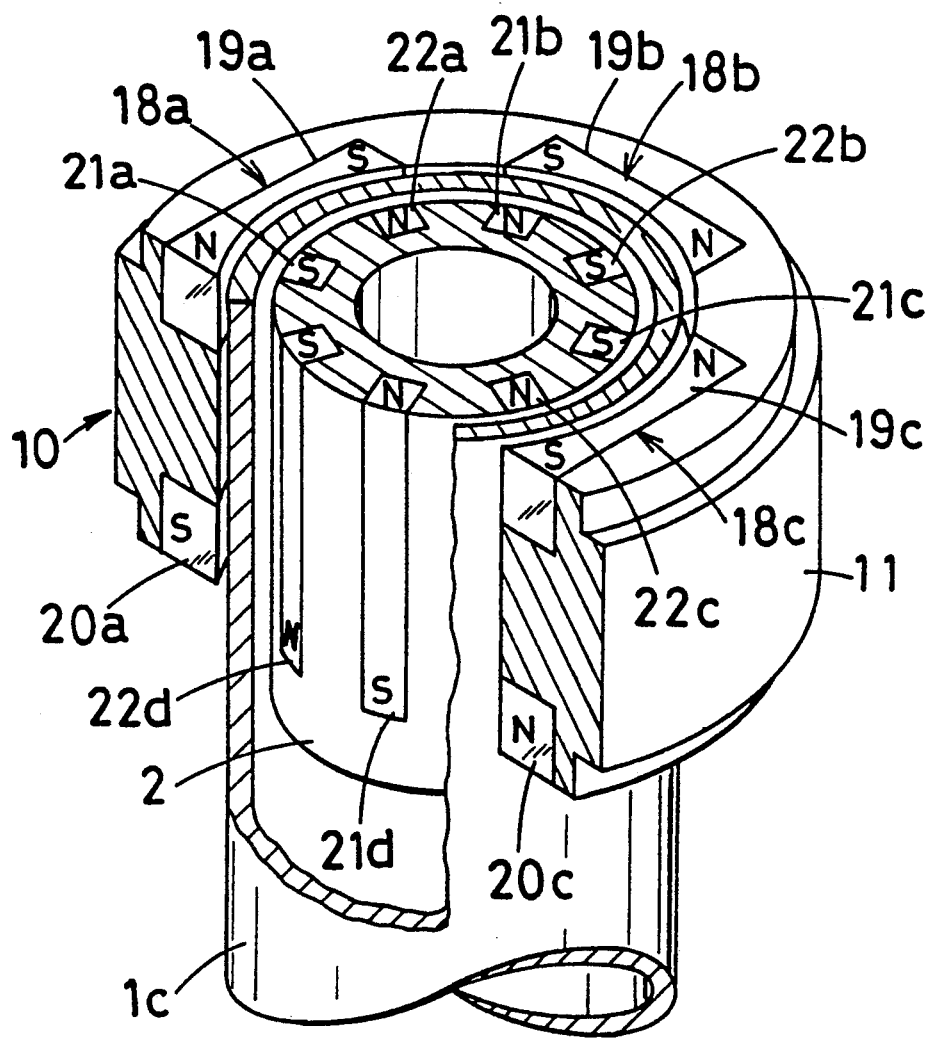
FIG. 2 is a perspective view partly broken away and showing a first magnetic coupling included in the device of FIG. 1.
Figure 3:
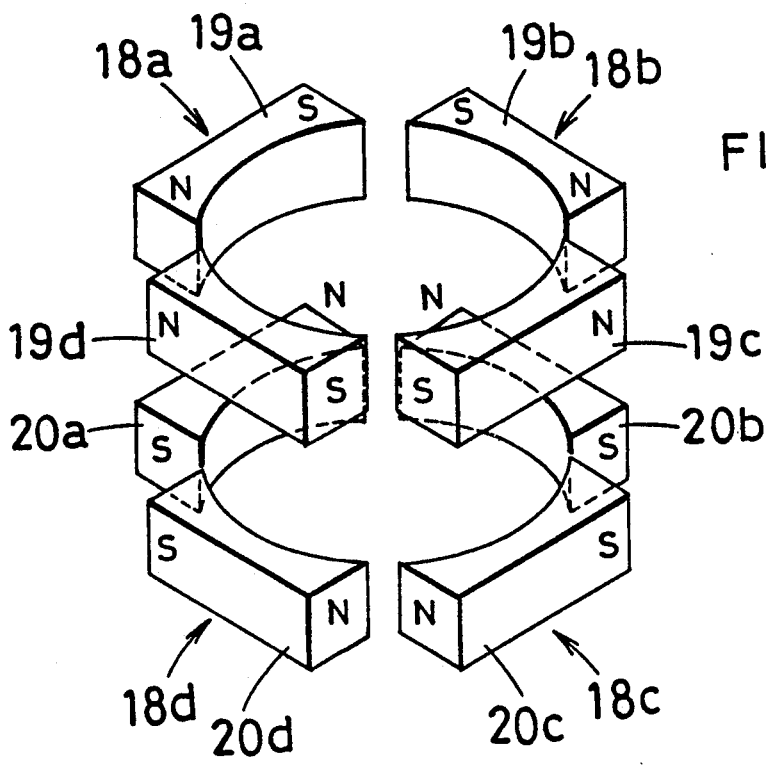
FIG. 3 is a perspective view showing the arrangement of permanent magnets providing a drive portion of the first magnetic coupling of FIG. 2.
Figure 4:
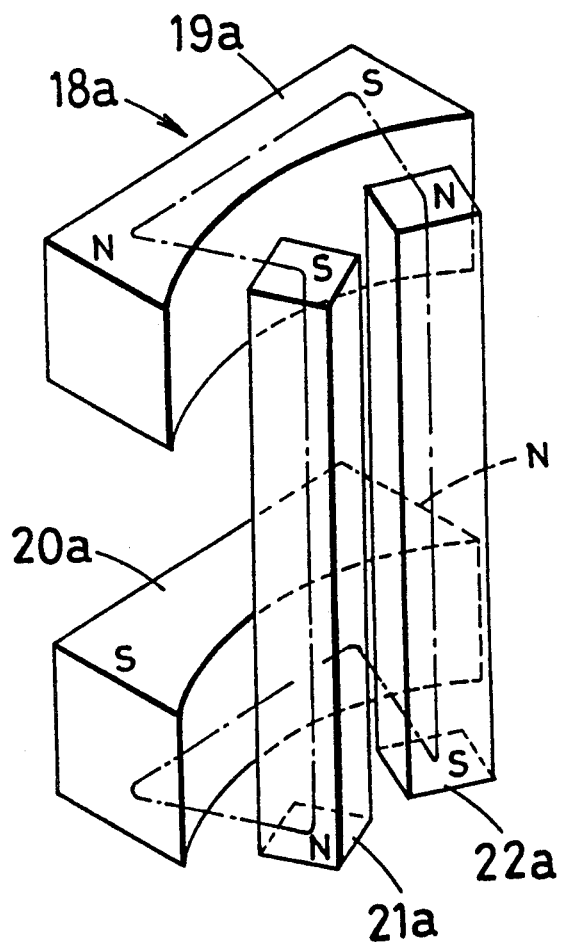
FIG. 4 is a perspective view showing the arrangement of permanent magnets of a first permanent magnet device included in the first magnetic coupling of FIG. 2.

FIGS. 2 to 4 show the first magnetic coupling 10 in greater detail.

Permanent magnet devices 18a, 18b, 18c, 18d are provided in the opposed peripheral surfaces of the first drive portion 11 and the lower portion of the outer rotor 2, respectively, at four portions equally divided circumferentially thereof.

The permanent magnet device 18a (18b, 18c, 18d) comprises an upper permanent magnet 19a (19b, 19c, 19d) and a lower permanent magnet 20a (20b, 20c, 20d) which are fixed as vertically spaced apart in the inner peripheral surface of the first drive portion 11 and extend circumferentially thereof, and a left permanent magnet 21a (21b, 21c, 21d) and a right permanent magnet 22a (22b, 22c, 22d) which extend vertically and are fixed in the outer peripheral surface of the outer rotor 2 and spaced apart circumferetially thereof. The upper and lower magnets 19a to 19d and 20a to 20d of the first drive portion 11 each have a magnetic pole at each of its right and left ends. The upper and lower magnets 19a (19b, 19c, 19d) and 20a (20b, 20c, 20d) are opposite in polarity at their right ends, as well as at their left ends. The left and right magnets 21a to 21d and 22a to 22d of the outer rotor 2 each have a magnetic pole at each of its upper and lower ends. The left and right magnets 21a (21b, 21c, 21d) and 22a (22b, 22c, 22d) are opposite in polarity at their upper ends, as well as at their lower ends. The upper-end magnetic pole of the left magnet 21a (21b, 21c, 21d) is opposed to the left-end magnetic pole of the upper magnet 19a (19b, 19c, 19d), the lower-end pole of the left magnet 21a (21b, 21c, 21d) to the left-end pole of the lower magnet 20a (20b, 20c, 20d), the upper-end pole of the right magnet 22a (22b, 22c, 22d) to the right-end pole of the upper magnet 19a (19b, 19c, 19d), and the lower-end pole of the right magnet 22a (22b, 22c, 22d) to the right-end pole of the lower magnet 20a (20b, 20c, 20d). The two magnetic poles in each opposed pair are opposite in polarity. The first permanent magnet device 18a and the third permanent magnet device 18c positioned symmetrically therewith are the same in the arrangement of magnetic poles. The second permanent magnet device 18b and the fourth permanent magnet device 18d positioned symmetrically therewith are identical in the arrangement of poles. Accordingly, the magnet devices 18a to 18d each have a closed magnetic path spreading out radially, axially and circumferentially of the outer rotor 2.

More specifically, in the first and third magnet devices 18a, 18c, the upper magnets 19a, 19c have an N pole at their left ends and an S pole at their right ends, the lower magnets 20a, 20c have an S pole at their left ends and an N pole at their right ends, the left magnets 21a, 21c have an S pole at their upper ends and an N pole at their lower ends, and the right magnets 22a, 22c have an N pole at their upper ends and an S pole at their lower ends. Each of these devices provides a closed magnetic path spreading out radially, axially and circumferentially of the outer rotor 2 as indicated in a dot-and-dash line in FIG. 4.

Conversely in the second and fourth magnetic devices 18b, 18d, the upper magnets 19b, 19d have an S pole at their left ends and an N pole at their right ends, the lower magnets 20b, 20d have an N pole at their left ends and an S pole at their right ends, the left magnets 21b, 21d have an N pole at their upper ends and an S pole at their lower ends, and the right magnets 22b, 22d have an S pole at their upper ends and an N pole at their lower ends. Each of these devices forms a closed magnetic path spreading out radially, axially and circumferentially of the outer rotor 2.

Since the closed magnetic paths are formed by the four permanent magnet devices 18a to 18d, attraction acts between the first drive portion 11 and the outer rotor 2. Because these magnetic paths spread out radially, axially and circumferentially of the outer rotor 2, the first drive portion 11 transmits a torque and an axial holding force to the outer rotor 2. When the first drive portion 11 is rotated, the outer rotor 2 is also rotated. When axially moved, the first drive portion 11 moves the outer rotor 2 also axially thereof.

The drive portion 13 of the second magnetic coupling 12 is opposed to the outer peripheral surface of large-diameter portion 3a of the inner rotor 3 with the lower cylindrical wall 1c positioned therebetween. The second magnetic coupling 12 has a driven portion provided in the peripheral surface of the large-diameter portion 3a. The second magnetic coupling 12 is known as disclosed for example, in Unexamined Japanese Patent Publication SHO 56-150650. The torque of the second drive portion 13 is transmitted to the inner rotor 3.

When the movable housing 9 moves upward or downward, the drive portions 11, 13 of the two couplings 10, 12 also move upward or downward, with the result that the two rotors 2, 3 are moved together upward or downward by the axial holding force of the first coupling 10.

When the first motor rotates the drive portion 11 of the first magnetic coupling 10, the torque is transmitted to the outer rotor 2 to rotate the outer rotor 2 independently of the inner rotor 3. Similarly, when the drive portion 13 of the second magnetic coupling 12 is rotated by the second motor, the torque is transmitted to the inner rotor 3, rotating the inner rotor 3 independently of the outer rotor 2.

Figure 5:
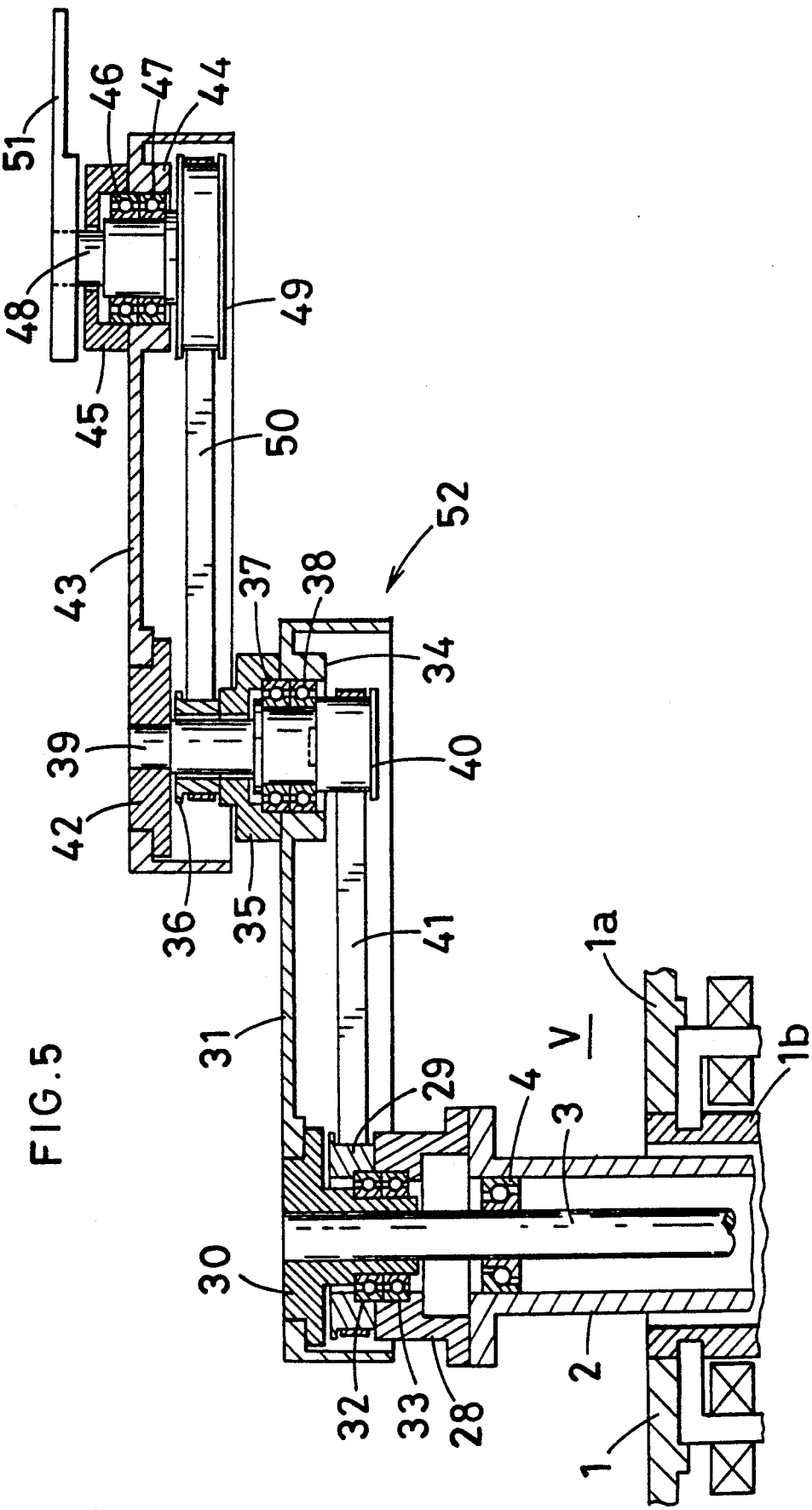
FIG. 5 is a side elevation partly broken away and showing the main portion of a semiconductor wafer handling apparatus incorporating the magnetic drive device of FIG. 1.
Figure 6:
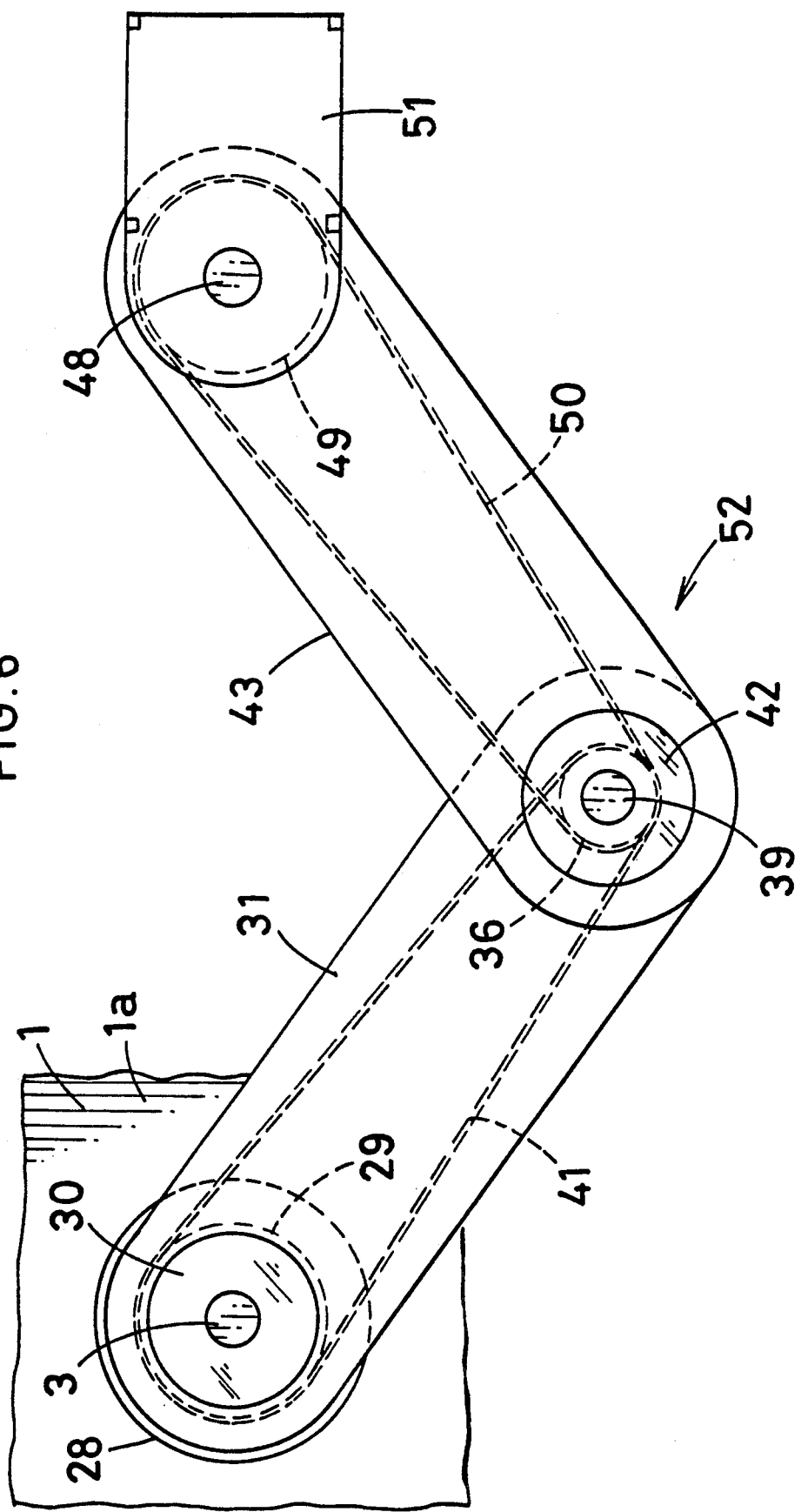
FIG. 6 is a plan view of the handling apparatus of FIG. 5.

FIGS. 5 and 6 show the main portion of an example of semiconductor wafer handling apparatus including the magnetic drive device described. In this case, the outer rotor 2 projects upward beyond the horizontal wall 1a of the vacuum shield 1 by a larger distance than in FIG. 1. The inner rotor 3 greatly projects upward beyond the upper end of the outer rotor 2.

The outer rotor 2 of the magnetic drive device projects upward beyond the upper end of the cylindrical wall 1b of the vacuum shield 1 into a vacuum V above the horizontal wall 1a. A first drive pulley 29 in the form of a cylinder is fixed to the upper end of the outer rotor 2 with a cylindrical housing 28 interposed therebetween. A horizontal first arm 31 has a base end fixed by a flange member 30 to the upper end of the inner rotor 3 which extends upward beyond the pulley 29. The flange member 30 has a lower portion extending through the pulley 29 to an inside upper portion of the housing 28. Bearings 32, 33 are provided around the lower portion inside the pulley 29 and the housing 28, rendering the outer rotor 2 and the first arm 31 rotatable relative to each other. The first arm 31 is in the form of a hollow member having an open bottom side. The pulley 29 is covered with the base end of the arm.

The first arm 31 has a boss portion 34 provided around an opening formed in the upper wall of its forward end. A second drive pulley 36 is fixed to the top of the boss portion 34 with a cylindrical housing 35 interposed therebetween. A vertical second arm rotating shaft 39 extends through and is rotatably supported by the boss portion 34 of the first arm 31 and the housing 35, with bearings 37, 38 provided around the shaft 39 inside the boss portion and the housing. The shaft 39 has a lower end fixedly carrying a first driven pulley 40 which is positioned inside the first arm 31 and under the boss portion 34 and which is coupled to the first drive pulley 29 by a first belt 41. The shaft 39 extends upward beyond the second drive pulley 36. A second arm 43 has a base end fixed by a flange member 42 to the upper end of the shaft 39. The second arm 43 is also in the form of a hollow member having an open bottom side. The second drive pulley 36 is covered with the arm base end.

The second arm 43 has a boss portion 44 provided around an opening in the upper wall of its forward end. A cylindrical housing 45 is fixed to the top of the boss portion 44. A holder rotating shaft 48 extends through the boss portion 44 and the housing 45 and is rotatably supported by bearings 46, 47 inside the boss portion and the housing. The shaft 48 has a lower end fixedly carrying a second driven pulley 49, which is positioned inside the second arm 43 and under the boss portion 44 and which is coupled to the second drive pulley 36 by a second belt 50. The shaft 48, extending upward beyond the housing 45, has a wafer holder 51 fixed to the upper end of the shaft. The first arm 31, the second arm 43 and the wafer holder 51 constitute a scalar robot 52.

The diameter ratio of the first drive pulley 29 to the first driven pulley 40 is 2:1. The diameter ratio of the second drive pulley 36 to the second driven pulley 49 is 1:2. The axis-to-axis distance between the inner rotor 3 and the second arm rotating shaft 39 is equal to the axis-to-axis distance between the second arm rotating shaft 39 and the holder rotating shaft 48.

When the two rotors 2, 3 rotate together at the same speed in the handling apparatus, the two rotors 2, 3 and the holder 51 rotate together without changing the relative position relationship therebetween.

When the two rotors 2, 3 rotate relative to each other, the two arms 31, 43 rotate in directions opposite to each other, thereby stretching or contracting the scalar robot 52 to shift the holder 51 radially of the rotors 2, 3. If the outer rotor 2 is at rest at this time, the holder 51 does not shift circumferentially of the rotors 2, 3 but moves along a radial line of the rotors 2, 3. Alternatively if the outer rotor 2 is in rotation, the holder 51 shifts also in the circumferential direction. In either case, the angle the holder 51 makes with a straight line through the axis of the two rotors 2, 3 and the axis of the holder rotating shaft 48 is constant at all times, permitting the holder 51 to move while always remaining in a definite posture with respect to the radial direction of the rotors 2, 3.

Figure 7:
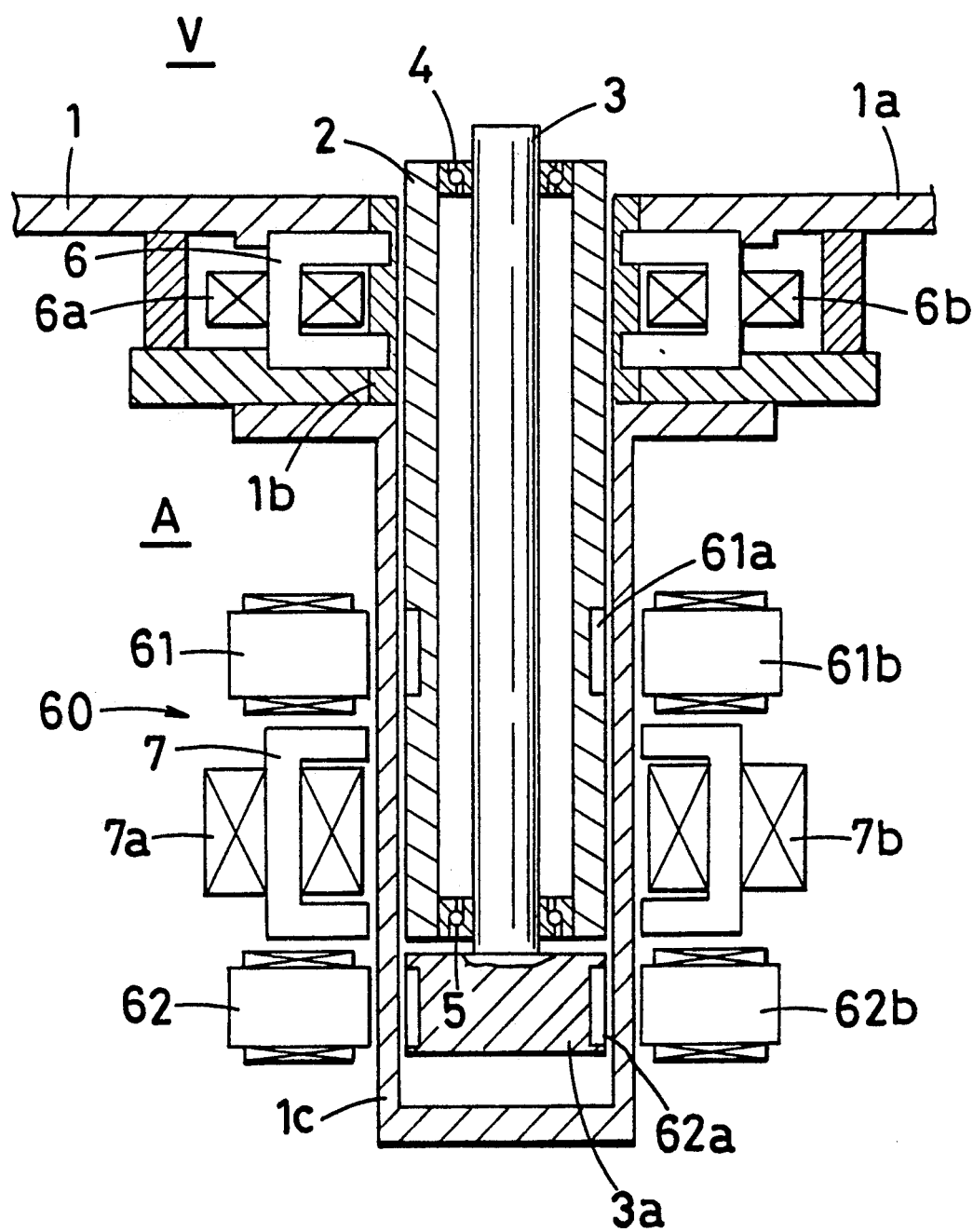
FIG. 7 is a view in vertical section showing another magnetic drive device embodying the invention.
Figure 8:
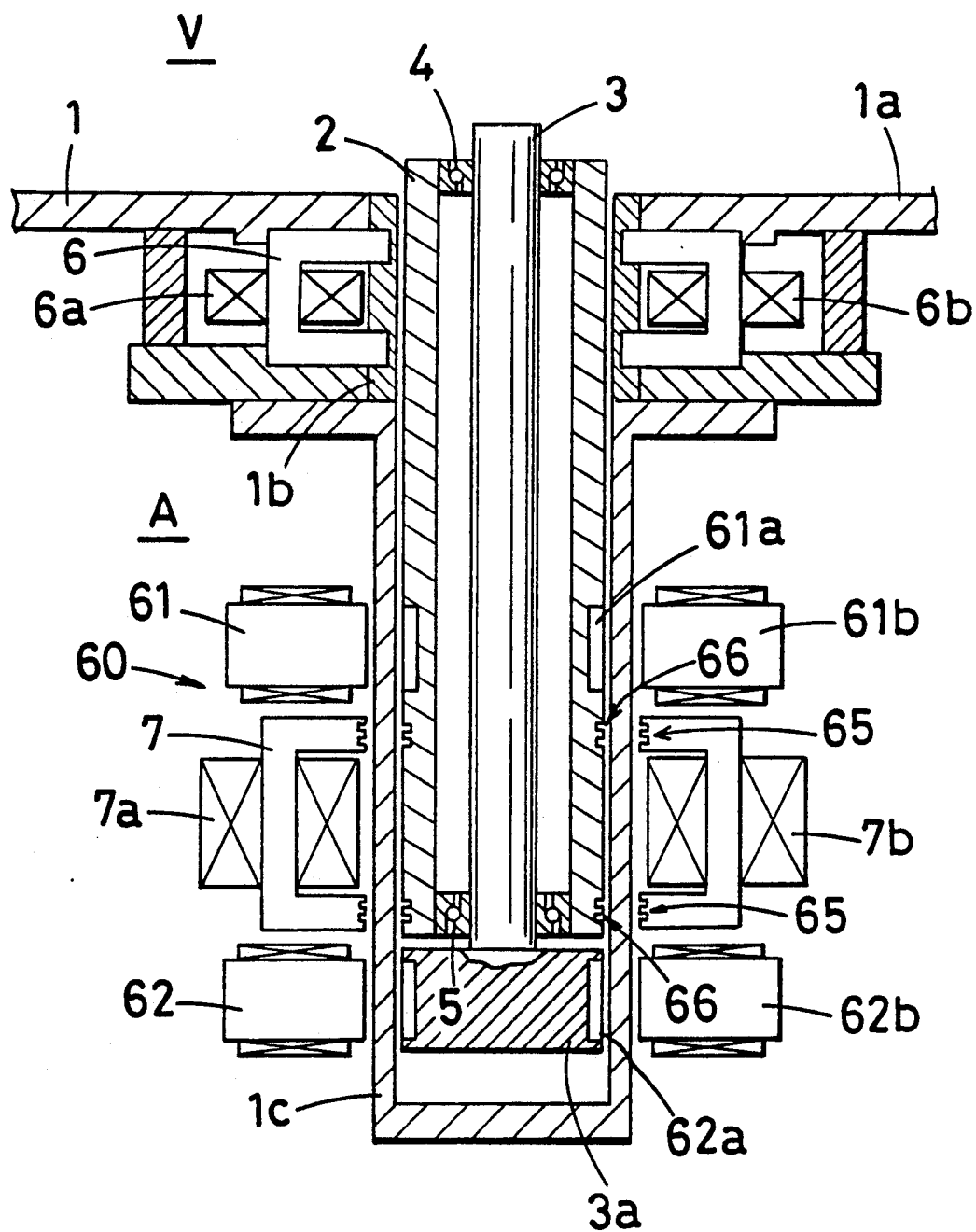
FIG. 8 is a view in vertical section showing another magnetic drive device embodying the invention.
Figure 9:
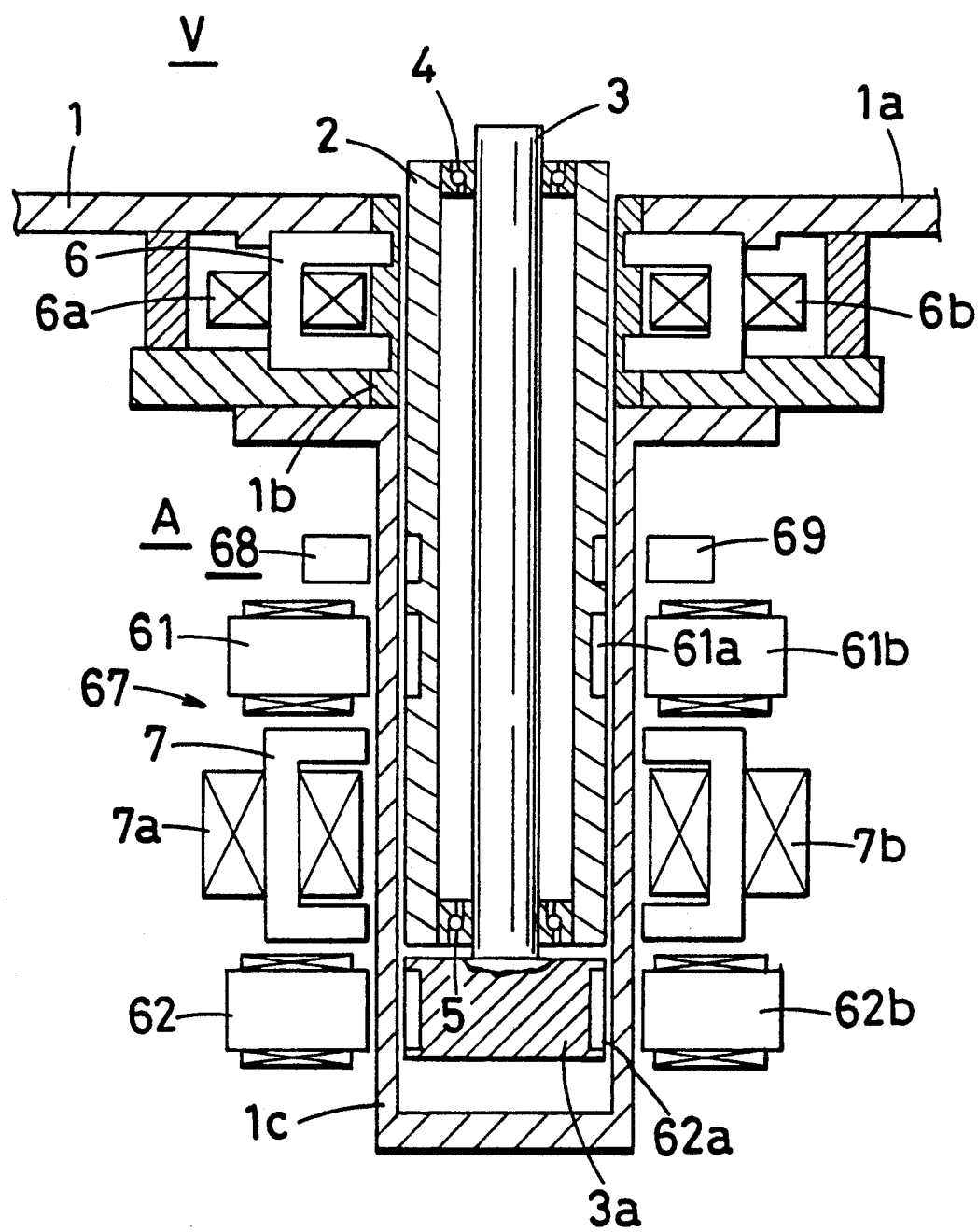
FIG. 9 is a view in vertical section showing still another magnetic drive device embodying the invention.

FIGS. 7, 8 and 9 show other magnetic devices which are each disposed in the atmosphere A outside a vacuum shield 1 for driving an outer rotor 2 and an inner rotor 3 which are arranged in a vacuum V inside the shield 1.

The magnetic drive device shown in FIG. 7 has a movable unit 60 corresponding to the movable unit 8 of FIG. 1 and comprising a first direct drive motor 61 in place of the first magnetic coupling 10 of FIG. 1 and a second direct drive motor 62 in place of the second magnetic coupling 12 of FIG. 1. The first motor 61 has a rotor (first motor rotor) 61a formed in an outer peripheral portion of the outer rotor 2. A motor stator (first motor stator) 61b for directly driving the first motor rotor 61a is disposed around a lower cylindrical wall 1c. The second motor 62 has a motor rotor (second motor rotor) 62a formed in the outer periphery of a large-diameter portion 3a of the inner rotor 3. A motor stator (second motor stator) 62b for directly driving the second motor rotor 62a is disposed around the lower cylindrical wall 1c. The movable unit 60 further comprises a movable magnetic bearing 7 for holding the outer rotor 2 radially and axially thereof. The movable magnetic bearing 7 and the first and second motor stators 61b, 62b are arranged in a movable housing (not shown) like the movable housing 9 of FIG. 1. When moved upward or downward, the movable housing moves the movable magnetic bearing 7 and the two motor stators 61b, 62b upward or downward along the lower cylindrical wall 1c.

When the movable unit 60 moves upward or downward in this case, the two rotors 2, 3 are moved together upward or downward by the axial holding force of the movable magnetic bearing 7. When the first motor rotor 61a is driven by the first motor stator 61b, the outer rotor 2 is rotated independently of the inner rotor 3. Similarly, when the second motor rotor 62a is driven by the second motor stator 62b, the inner rotor 3 is rotated independently of the outer rotor 2.

The present device is the same as the device shown in FIG. 1 with the exception of the above feature.

In the case of the magnetic drive device shown in FIG. 8, each of electromagnets 7a, 7b of a movable magnetic bearing 7 and an outer rotor 2 are toothed at portions thereof opposed to each other as indicated at 65, 66, respectively. These toothed portions 65, 66 each have a plurality of teeth arranged in the axial direction and are adapted to produce an axial holding force. The toothed portion 65 of each electromagnet 7a (7b) is provided by forming a plurality of circumferential grooves in the inner periphery thereof, while the toothed portion 66 of the outer rotor 2 is provided by forming a plurality of annular grooves in the outer periphery thereof.

With the exception of the above feature, the device has the same construction as the device of FIG. 7.

In the case of the magnetic drive device shown in FIG. 9, a movable unit 67 has a movable housing (not shown) which is provided with a drive portion 69 of a magnetic coupling 68 in addition to a movable magnetic bearing 7 and first and second motor stators 61b, 62b. The magnetic coupling 68 has a driven portion formed in the outer peripheral surface of an outer rotor 2 and opposed to the drive portion 69. The magnetic coupling drive portion 69 is mounted on the movable housing so as to be freely rotatable and movable upward or downward with the movable magnetic bearing 7 and the motor stators 61b, 62b.

Figure 10:
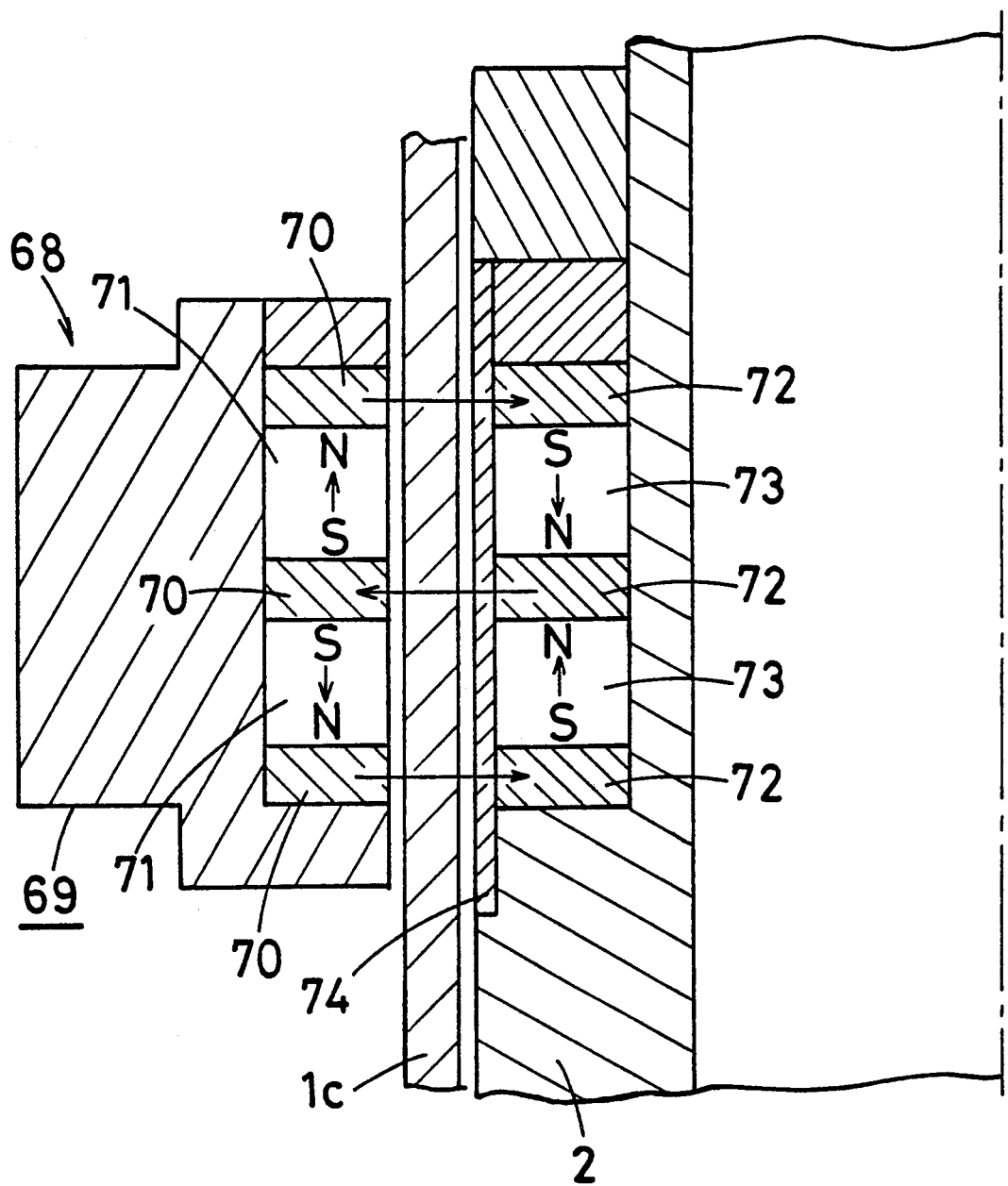
FIG. 10 is a view in vertical section showing a magnetic coupling included in the device of FIG. 9.

The magnetic coupling 68 is a known one, an example of which is shown in FIG. 10. With reference to FIG. 10, the drive portion 69 of the coupling 68 is in the form of a ring and comprises a plurality of magnetic pole members 70 arranged axially in its inner periphery at a spacing, and a plurality of permanent magnets 71 arranged between the pole members 70. In corresponding relation with the drive portion, the outer rotor 2 is provided in its outer periphery with a plurality of magnetic pole members 72 arranged axially at a spacing, and a plurality of permanent magnets 73 arranged between the pole members 72, whereby the drive portion of the coupling 68 is formed. A sleeve 74 is fitted around these pole members 72 and permanent magnets 73. Each of the permanent magnets 71, 73 has magnetic poles at its axial opposite ends as illustrated. Magnetic paths are formed between the permanent magnets 71 and the magnetic pole members 70 of the drive portion 69 and the permanent magnets 73 and the magnetic pole members 72 of the driven portion as indicated by arrows in FIG. 10. By virtue of a magnetic attraction occurring between the drive portion pole members 70 and the driven portion pole members 72, an axial holding force is transmitted from the drive portion 69 to the outer rotor 2, permitting the drive portion 69 to rotate with the rotation of the outer rotor 2.

When the movable unit 67 moves upward or downward in this case, the two rotors 2, 3 are moved together upward or downward by the combination of the axial holding force afforded by the movable magnetic bearing 7 and the axial holding force given by the magnetic coupling 68.

With the exception of the feature described above, the present device is the same as the device shown in FIG. 7.

The present invention can be embodied also as magnetic drive devices wherein only one rotor is driven in rotation and also axially thereof. For example, when the embodiment of FIG. 1 is so modified, only one rotor 2 is disposed in the cylindrical walls 1b, 1c, and the movable housing 9 is provided only with the drive portion 11 of the first magnetic coupling 10 for driving the rotor 2 in rotation and in the axial direction. The same is true of the embodiments of FIGS. 7 to 9.

What is claimed is:

1. A magnetic drive device comprising:
   a cylindrical wall;
   a rotor disposed inside said cylindrical wall, said rotor being rotatable and axially movable with respect to said cylindrical wall without contact with said cylindrical wall;
   a housing disposed around said cylindrical wall, said housing being axially movable with respect to said cylindrical wall;
   a motor provided on said housing;
   a magnetic coupling having a drive portion disposed on said housing, said drive portion being rotatable and axially movable for transmitting a torque from said motor to said rotor and an axial holding force from said drive portion to said rotor; and
   a movable magnetic bearing axially movably disposed on said housing, said movable magnetic bearing being axially movable with said drive portion of said magnetic coupling for holding said rotor radially of said magnetic bearing without contact therewith.

2. The magnetic drive of claim 1, wherein said rotor has a peripheral surface opposite said drive portion of said magnetic coupling;
   wherein said cylindrical wall is positioned between said drive portion of said magnetic coupling and said peripheral surface of said rotor; and
   wherein said drive portion of said magnetic coupling and said peripheral surface of said rotor are provided with a plurality of permanent magnet devices, each of said permanent magnet devices comprising opposed permanent magnets, said permanent magnets of each said permanent magnet device being arranged to form in each said permanent magnet device a closed magnetic path spreading out radially and axially of said rotor.

3. The magnetic drive device of claim 2, wherein said permanent magnets of each said permanent magnet device are arranged to form in said permanent magnet device a closed magnetic path which also spreads out circumferentially of said rotor.

4. The magnetic drive device of claim 1, wherein said rotor comprises an outer rotor in the form of a cylinder and an inner rotor inserted in said outer rotor and having at least an end portion projecting beyond an end of said outer rotor, said inner rotor being rotatably supported relative to said outer rotor;
   wherein said magnetic coupling comprises a first magnetic coupling having a first drive portion and a second magnetic coupling having a second drive portion, said second drive portion being disposed on said movable housing and axially movable with said first drive portion and said movable magnetic bearing, said second drive portion being rotatable;
   said motor comprising a first motor and a second motor; and
   wherein said drive portion is operable to transmit a torque from said second motor to said end portion of said inner rotor projecting beyond said end of said outer rotor and to transmit an axial holding force from said second drive portion to said end portion of said inner rotor projecting beyond said end of said outer rotor.

5. A magnetic drive device comprising:
   a cylindrical wall;

a rotatable member disposed inside said cylindrical wall, said rotatable member being rotatable and axially movable with respect to said cylindrical wall, said rotatable member having a motor rotor formed thereon;

a fixed magnetic bearing fixedly provided on said cylindrical wall for holding said rotatable member radially with respect to said cylindrical wall without contact with said cylindrical wall;

a housing disposed around said cylindrical wall, said housing being axially movable with respect to said cylindrical wall;

a motor stator disposed on said movable housing, said motor stator being axially movable for directly driving said motor rotor; and a movable magnetic bearing axially movably disposed on said housing, said movable magnetic bearing being axially movable with said motor stator for holding said rotatable member radially and axially of said movable magnetic bearing without contact therewith.

6. The magnetic drive device of claim 5, wherein said rotatable member comprises an outer rotor in the form of a cylinder and an inner rotor inserted in said outer rotor and having at least an end portion projecting beyond an end of said outer rotor, said inner rotor being rotatably supported relative to said outer rotor;

wherein said motor rotor comprises a first motor rotor and a second motor rotor, said second motor rotor being formed with said end portion of said inner rotor; and wherein said motor stator comprises a first motor stator and a second motor stator, said second motor stator being disposed on said movable housing and axially movable with said first motor stator and said movable magnetic bearing for directly driving said second motor rotor.

7. The magnetic drive device of claim 5, wherein said movable magnetic bearing and said rotatable member are toothed at opposite portions thereof for producing an axial holding force.

8. The magnetic drive device of claim 6, wherein said movable magnetic bearing and said outer rotor are toothed at opposite portions thereof for producing an axial holding force.

9. The magnetic drive device of claim 5, further comprising a magnetic coupling including a drive portion for transmitting an axial holding force to said rotatable member;

wherein said drive portion is disposed on said housing and is axially movable with said motor stator and said movable magnetic bearing.

10. The magnetic drive device of claim 6, further comprising a magnetic coupling including a drive portion for transmitting an axial holding force to said outer rotor;

wherein said drive portion is disposed on said movable housing and is axially movable with said first motor stator, said second motor stator, and said movable magnetic bearing.

* * * * *